United States Patent
Le Garrec et al.

(10) Patent No.: US 8,517,278 B2
(45) Date of Patent: Aug. 27, 2013

(54) LUMINOUS MODULE FOR MICROCIRCUIT DEVICE

(75) Inventors: Loïc Le Garrec, Vitre (FR); Agnès Duval, Vitre (FR); Denis Vere, Argentre du Plessis (FR)

(73) Assignee: Oberthur Technologies, Levallois Perret (FR)

( * ) Notice: Subject to any disclaimer, the term of this patent is extended or adjusted under 35 U.S.C. 154(b) by 0 days.

(21) Appl. No.: 13/224,635

(22) Filed: Sep. 2, 2011

(65) Prior Publication Data

US 2012/0055999 A1    Mar. 8, 2012

(30) Foreign Application Priority Data

Sep. 2, 2010  (FR) .................... 10 56974
Sep. 2, 2010  (FR) .................... 10 56975

(51) Int. Cl.
| | | |
|---|---|---|
| *G06K 19/06* | (2006.01) | |
| *G06K 19/00* | (2006.01) | |
| *G06K 5/00* | (2006.01) | |
| *G07F 19/00* | (2006.01) | |
| *G07D 11/00* | (2006.01) | |
| *G06Q 40/00* | (2012.01) | |
| *G08B 13/14* | (2006.01) | |
| *G08B 5/00* | (2006.01) | |

(52) U.S. Cl.
USPC ........... 235/492; 235/379; 235/380; 235/487; 235/493; 340/572.1; 340/572.4; 340/572.8; 340/815.4

(58) Field of Classification Search
USPC ..... 340/572.1, 572.4, 572.8, 815.4; 235/487, 235/492, 493, 379, 380
See application file for complete search history.

(56) References Cited

U.S. PATENT DOCUMENTS

| | | | | |
|---|---|---|---|---|
| 4,990,759 A | * | 2/1991 | Gloton et al. | 235/492 |
| 5,345,367 A | * | 9/1994 | Pierce et al. | 362/555 |
| 5,736,727 A | * | 4/1998 | Nakata et al. | 235/487 |
| 5,959,289 A | * | 9/1999 | Okada et al. | 235/487 |
| 6,193,156 B1 | * | 2/2001 | Han et al. | 235/454 |
| 6,406,935 B2 | * | 6/2002 | Kayanakis et al. | 438/106 |
| 6,547,135 B2 | * | 4/2003 | Solirenne et al. | 235/382 |
| 6,719,206 B1 | * | 4/2004 | Bashan et al. | 235/492 |
| 6,786,419 B2 | * | 9/2004 | Kayanakis | 235/492 |
| 2001/0010333 A1 | * | 8/2001 | Han et al. | 235/454 |
| 2002/0033419 A1 | * | 3/2002 | Solirenne et al. | 235/492 |
| 2002/0133713 A1 | * | 9/2002 | Fieschi et al. | 713/200 |
| 2003/0034400 A1 | * | 2/2003 | Han et al. | 235/487 |
| 2003/0052177 A1 | * | 3/2003 | Halope | 235/492 |
| 2003/0106935 A1 | * | 6/2003 | Burchette, Jr. | 235/380 |
| 2003/0201331 A1 | * | 10/2003 | Finkelstein | 235/487 |
| 2004/0222505 A1 | * | 11/2004 | Laackman et al. | 257/679 |

(Continued)

FOREIGN PATENT DOCUMENTS

| | | |
|---|---|---|
| EP | 1 847 946 | 10/2007 |
| JP | 62009487 A * | 1/1987 |

(Continued)

*Primary Examiner* — Daniel Walsh
(74) *Attorney, Agent, or Firm* — Cozen O'Connor (57) ABSTRACT

The electronic module (18) for an electronic device (10) such as a microcircuit card, comprises a substrate (20) delimiting first (20A) and second (20B) opposite faces. More particularly, the module (18) comprises a light source (26) borne by the second face (20B) of the substrate (20) and capable of illuminating a visible part of the electronic device.

22 Claims, 3 Drawing Sheets

(56) References Cited

U.S. PATENT DOCUMENTS

| | | | |
|---|---|---|---|
| 2005/0087606 A1* | 4/2005 | McCumber | 235/491 |
| 2005/0139685 A1* | 6/2005 | Kozlay | 235/492 |
| 2006/0060656 A1* | 3/2006 | Waters | 235/487 |
| 2006/0124753 A1* | 6/2006 | Scholz et al. | 235/492 |
| 2006/0289632 A1* | 12/2006 | Walker et al. | 235/380 |
| 2007/0272761 A1* | 11/2007 | Ayala et al. | 235/492 |
| 2008/0054077 A1 | 3/2008 | Zellner et al. | |
| 2008/0217414 A1* | 9/2008 | Ito | 235/492 |
| 2008/0223937 A1* | 9/2008 | Preta et al. | 235/492 |
| 2008/0282540 A1 | 11/2008 | Singleton | |
| 2008/0296606 A1* | 12/2008 | Ottobon et al. | 257/100 |
| 2009/0015411 A1* | 1/2009 | Li | 340/572.1 |
| 2009/0065589 A1* | 3/2009 | Korhonen et al. | 235/492 |
| 2009/0109701 A1* | 4/2009 | Hsieh et al. | 362/604 |
| 2009/0159712 A1* | 6/2009 | Mullen et al. | 235/493 |
| 2009/0167495 A1 | 7/2009 | Smith et al. | |
| 2009/0206164 A1* | 8/2009 | Kluge | 235/492 |
| 2009/0245029 A1* | 10/2009 | Kam | 368/10 |
| 2009/0315320 A1* | 12/2009 | Finn | 283/107 |
| 2010/0001077 A1* | 1/2010 | Kluge | 235/488 |
| 2010/0176205 A1* | 7/2010 | Patrice | 235/492 |
| 2010/0224685 A1* | 9/2010 | Aoki | 235/488 |
| 2010/0308976 A1* | 12/2010 | Seban et al. | 340/10.5 |
| 2011/0025463 A1* | 2/2011 | Palmade et al. | 340/10.1 |
| 2011/0037607 A1* | 2/2011 | Vere et al. | 340/815.45 |
| 2011/0174874 A1* | 7/2011 | Poznansky et al. | 235/379 |
| 2012/0037710 A1* | 2/2012 | Le Garrec et al. | 235/492 |
| 2012/0055999 A1* | 3/2012 | Le Garrec et al. | 235/492 |
| 2012/0061476 A1* | 3/2012 | Le Garrec et al. | 235/492 |
| 2012/0138691 A1* | 6/2012 | Bosquet et al. | 235/492 |

FOREIGN PATENT DOCUMENTS

| | | | |
|---|---|---|---|
| JP | 62134780 A * | 6/1987 | |
| JP | 2004 094561 | 3/2004 | |
| JP | 2004094561 A * | 3/2004 | |
| JP | 2004 265176 | 9/2004 | |
| JP | 2004265176 A * | 9/2004 | |
| JP | 2005216044 A * | 8/2005 | |
| JP | 2005293181 A * | 10/2005 | |
| WO | WO 2005/027036 | 3/2005 | |
| WO | WO 2005/071606 | 8/2005 | |
| WO | WO 2010/007287 | 1/2010 | |

* cited by examiner

LUMINOUS MODULE FOR MICROCIRCUIT DEVICE

RELATED APPLICATIONS

This Application claims priority to French patent application no. 10/56974, filed on Sep. 2, 2010, and no. 10/56975, also filed on Sep. 2, 2010, both of which are hereby incorporated by reference in their entireties.

FIELD OF THE INVENTION

The present invention relates to a module for an electronic device and an electronic device including such a module.

The invention applies particularly to any type of portable or pocket electronic device capable of incorporating such a module, such as a USB key, an RFID (Radio Frequency Identification) tag, a chip card, etc.

The invention applies more particularly but not exclusively to microcircuit cards equipped with an antenna, such as the so-called contactless cards allowing establishment of contactless communication with an external terminal at a predefined communication frequency, such as for example the 13.56 MHz frequency defined by the ISO 14 443 standard.

It also applies to the so-called hybrid or dual cards allowing, in addition to the establishment of contactless communication, communication with contact through an external contact interface capable of making contact with a suitable reader.

BACKGROUND OF THE INVENTION

Generally, the module comprises an electrically non-conductive substrate which bears the microcircuit on one of its faces and, in the case of contact type cards, an external contact interface on the opposite face, this interface being electrically connected to the microcircuit, through the substrate for example.

Dual cards generally comprise a body which incorporates the antenna as well as the electronic module, housed in a cavity provided in the body.

The antenna and the microcircuit are then conventionally connected electrically by means of metal studs during the interleaving of the module into the body.

Such a structural arrangement makes it possible to obtain relatively good communication range because the dimensions of the antenna are maximized within the limit of the dimensions of the card body. However, the connection of the microcircuit to the antenna has a certain number of disadvantages, particularly in terms of reliability and of production efficiency.

In order to correct these disadvantages, it is thus known to integrate the antenna directly into the electronic module, for example on the substrate bearing the microcircuit, and then to transfer the module into the body of the card using traditional interleaving techniques for conventional contact type cards.

Ordinarily, the dimensions of the substrate are limited to the dimensions of the interface of external contacts having a generally square or circular shape so that the substrate is entirely masked by the metal interface.

But the incorporation of the antenna into the module imposes a substantial increase in the dimensions of that substrate so that the antenna has an effective reception area for the magnetic field that is sufficient to maintain a satisfactory communication range.

However, in this case, a relatively large area of the substrate is not covered by the antenna and by the external contact interface, the antenna extending generally along the periphery of the substrate. This surface of substrate in the raw state produces a particularly unattractive effect in the card and gives an impression of poor quality manufacture.

SUMMARY OF THE INVENTION

The disclosed embodiments have the particular object of correcting these disadvantages. To this end, the disclosed embodiments have as their object an electronic module which is to be mounted on a cavity of the body of an electronic device, such as a microcircuit card, the module comprising a substrate delimiting first and second opposite faces, the first face being designed to be oriented towards the outside of the electronic device so that it is visible from outside the electronic device, the second face being designed to be oriented towards the bottom of the cavity, the module including a light source borne by the second face of the substrate and capable of lighting a part of the electronic device, said part being visible from outside said device.

The part of the device which is illuminated according to the disclosed embodiments of the invention may be a part of the module or another part of the electronic device.

Thus a first embodiment of the invention has as its object an electronic module for an electronic device such as a microcircuit card, comprising a substrate delimiting first and second opposite faces, the module comprising a luminous source borne by the second face of the substrate and capable of illuminating the first face through the substrate.

In this first embodiment of the invention, the luminous source makes it possible to backlight the module when it is supplied with power and noticeably improves the visual appearance of the device, a chip card for example, by producing a high quality effect. In addition, as the source is directly borne by the module, the manufacture of the card according to the invention is relatively simple and is compatible with conventional interleaving processes.

A module according to this first embodiment of the invention can also include one or more of the following features:
- the substrate includes a light transmission region extending between the two faces;
- the first face is designed to be visible and the second face is designed to be masked when the module is assembled within the electronic device;
- the substrate bears on the first face a design and the light source is arranged so as to backlight the design;
- the module includes a microcircuit borne on the second face of the substrate;
- the module includes an interface of external contacts connected to the microcircuit and borne by the first face of the substrate;
- the module comprises a near-field communication antenna connected to the microcircuit and borne by the module substrate;
- the substrate has a generally oblong shape;
- the light source comprises a light-emitting diode;
- the light source is arranged so as to illuminate the substrate by direct light;
- the light source consists of a component comprising a light-emitting part arranged at least partially facing the substrate;
- the substrate is made of a material consisting substantially of glass-epoxy.

The invention also has as its object an electronic device, such as a microcircuit card, comprising a module and a body provided with a cavity for receiving the module, the module is according to this first embodiment of the invention, the second face of the substrate being placed facing a bottom of the cavity.

The invention also has as its object an electronic device, such as a microcircuit card, comprising a module according to this first embodiment except in that this module does not include a light source, and a body provided with a cavity for receiving the module, the module comprising a substrate delimited by first and second opposite faces, the second face being arranged facing a bottom of the cavity, the device including a light source arranged within the body to light the first face of the substrate through said substrate.

In this case, by preference, the light source is placed at the bottom of the cavity.

Preferably, this device is a microcircuit card of the contactless, dual or contact type.

According to a second embodiment, the invention has as its object a module designed to be mounted on a microcircuit card to illuminate at least a part of an edge of said card.

This second embodiment of the invention exploits the fact that the majority of contact card readers leave the edge of the card exposed. The illumination of the edge is also especially esthetic and conspicuous. Indeed, when the edge of the card is illuminated, the user has a general impression of a color change in the card which is especially remarkable.

Preferably, the card can comprise two light sources having two distinct colors indicating two distinct communication states.

The invention also aims to a card incorporating a module according to this second embodiment.

A card according to this second embodiment of the invention can additionally include one or more of the following features:
- the body includes a region, capable of transmitting the light emitted by the luminous means, extending at least partially along the edge, the luminous means being arranged within the body so as to illuminate the edge of the body by way of this region;
- the transmission region is made of a first material and is surrounded at least partially by a second material, the materials being selected in such a way to constitute an optical waveguide in at least one direction;
- the body consisting of a stack of layers extending through the body, the transmission region constituting one of the layers of the stack;
- the luminous means is arranged within the transmission region;
- the luminous means is optically concealed between the first and second faces of the card;
- the card includes a module comprising the microcircuit and the luminous means, the body including a cavity for receiving the module;
- the cavity is made partially within the thickness of the transmission region so that the luminous means extends at least partially into the interior of the transmission region;
- the module comprises a substrate delimiting a first face designed to be visible and a second, opposite face destined to face the cavity, the second face bearing at least the luminous means;
- the card includes a near-field communication antenna connected to the microcircuit and to the luminous means;
- the card includes first and second near-field communication antennas connected respectively to the microcircuit and to the luminous means;
- the card includes a module comprising the microcircuit and the luminous means, the antenna or antennas being incorporated into the module;
- the luminous means is connected electrically to an external power supply contact extending over the card and capable of making contact with an external contact card reader;
- the luminous means is capable of being controlled according to the communication state of the microcircuit;
- the card includes first and second luminous means capable of being controlled according to the first and second communication states of the microcircuit;
- the card is a microcircuit card of the contactless, dual or contact type.

The device incorporating the module may have a thickness of 0.76 mm, (corresponding to ISO 7816 format) +/−10%.

Other features and advantages of the invention will appear in the light of the description that follows, made with reference to the appended drawings in which.

Figure 1:
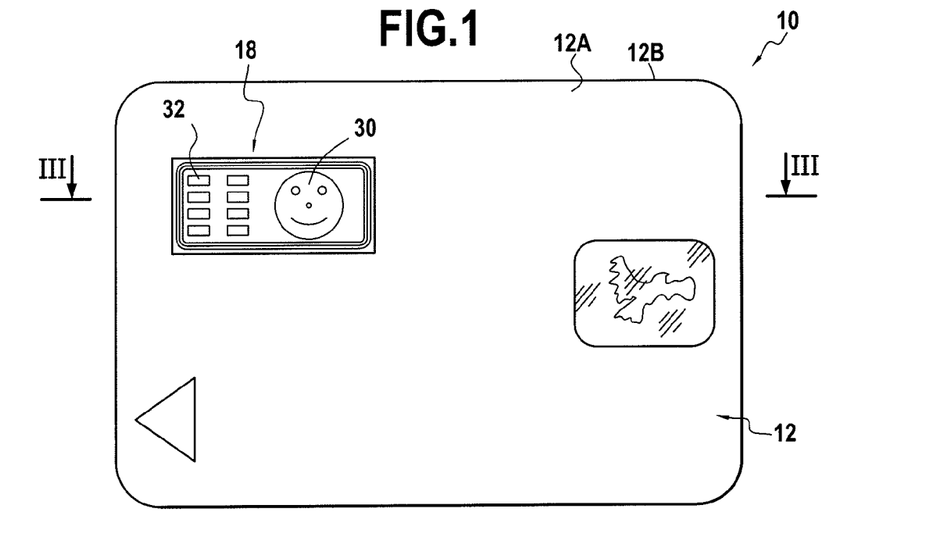
FIG. 1 shows an electronic device including a light source according to a first embodiment of the invention.
Figure 2:
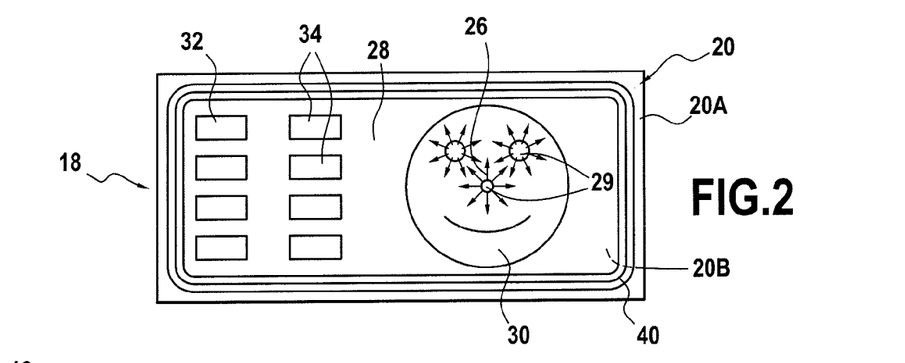
FIG. 2 shows an enlarged scale top view of an electronic module of the device in FIG. 1.
Figure 3:
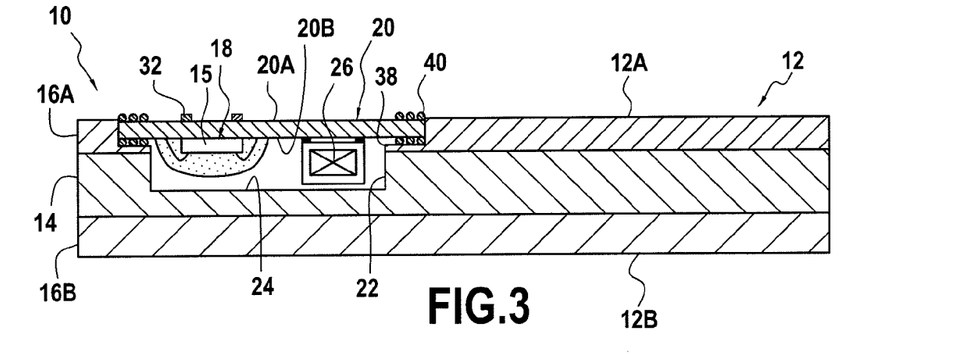
FIG. 3 shows the section view along the line III-III in FIG. 1.

An electronic device according to a first embodiment of the invention is shown in FIGS. 1 through 3.

This electronic device is labeled with the general reference number 10. The electronic device 10 is, in the embodiment described, a microcircuit card. As a variation, the device 10 can be a page of a passport such as the cover of the passport or even a self-adhesive label such as a sticker, etc.

As illustrated in FIG. 1, the device 10 comprises a body 12 in the general shape of a card delimiting first 12A and second 12B opposite faces.

In this embodiment, the body 12 defines the outside dimensions of the card 10. In this example and by preference, the dimensions of the card 10 are defined by the ID-1 format of the ISO 7816 standard which is the format used conventionally for banking card with dimensions of 86 millimeters by 54 millimeters.

Of course, other card formats can also be used, such as the ID-000 format of the same standard for example.

Preferably, the card body 12 is formed by lamination, that is by the formation, for example by means of a press and in a hot laminating operation, of a stack of laminated layers or sheets made for example of thermoplastic material.

For example, in this embodiment, the body 12 comprises a stack of at least three layers: a central layer 14 constituting a data printing layer interleaved between two preferably transparent external layers 16A, 16B. Of course, the body 12 can be made in a single layer or of more than three layers.

As a variation, the body 12 can be formed by molding, for example out of plastic. Conventionally, the device 10 includes a microcircuit 15 capable of exchanging, processing and/or storing data.

More particularly, the body 12 includes an electronic module 18 according to the invention. The microcircuit module 18 is illustrated in detail in FIG. 2. In conformity with the invention, the module 18 comprises a substrate 20 delimiting first 20A and second 20B opposite faces, the first face 20A being designed to be visible from outside while the second face 20B, opposite the first face 20A, is designed to be masked when the module 18 is assembled within the device 10.

As shown in FIG. 3, the body 12 includes a cavity 22 for receiving this module 18. Thus the module 18, once assembled within the device 10, that is once housed in the cavity 22, has a first outside face 20A of the substrate 20 visible from the outside and a second inner face 20B, opposite the first face 20A, which is oriented to face a bottom 24 of the cavity 22.

In a variation not illustrated in the figures, the module 18 is entirely incorporated into the body, for example in this case, the module is visible by transparency from part of the body at least. For example, this variation is well suited to the case where the device is a passport or possibly a sticker.

In this embodiment, the module 18 also includes a light source 26 borne by the second face 20B of the substrate 20 and capable of illuminating through the substrate 20, a part of the device visible from outside the device, corresponding to the first face 20A or a part of the first face 20A. The arrangement of this light source 26 allows backlighting of the substrate 20.

For example, the substrate 20 of the module 18 includes at least one region 28 for transmitting light 26 running through the substrate 20. The transmission region 28 may be made up of the whole substrate 20. The region 28 is for example translucent, even transparent to the light emitted by the source 26. The source 26 has an emission spectrum comprised preferably within the visible light range.

Preferably, the substrate 20 is made of a material capable of transmitting light.

For example, the substrate 20 is made for example of a material comprised substantially of glass-epoxy which is a material translucent to visible light. As a variation, the substrate 20 can be made of a material comprised essentially of PET, of Teflon, of polyimide, of polyester or of a mixture of these compounds.

Preferably, the light source 26 is a light-emitting diode. As is known per se, a diode 26 is an electronic component capable of emitting light when an electrical current passes through it.

Preferably, the diode 26 is of the SMC (surface-mount component) type. Thus, in conventional fashion, a surface-mounted component can be applied to a substrate of a printed circuit by adhesive bonding, brazing or soldering, unlike a component provided with pins, the assembly whereof to the substrate requires making holes in the substrate to allow passage of the pins.

Preferably, the light source 26 is arranged so as to illuminate the substrate 20 substantially by direct light.

Figure 4:
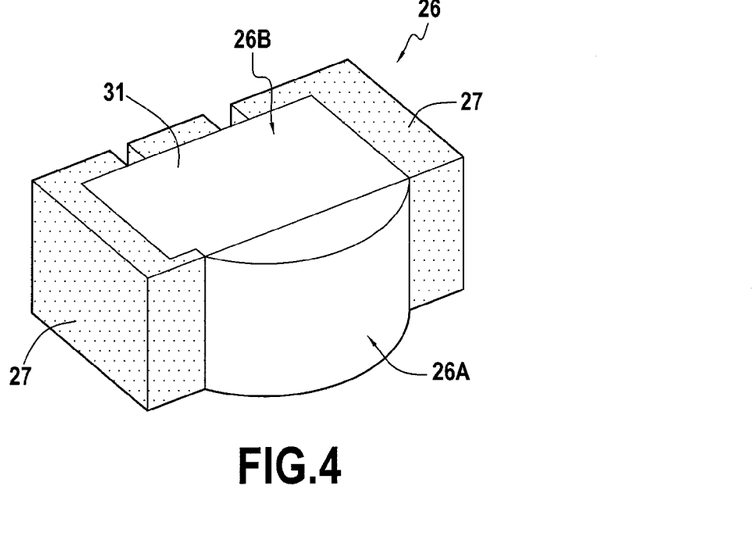
FIG. 4 is a detail perspective view of the light source shown in section in FIG. 3.

A detail view of the light source 26 is shown in FIG. 4. In the example described, the light source 26 consists of a component comprised of a first, light-emitting part 26A and a second part 26B constituting an electrical connector of the component 26 with an external electronic circuit, such as for example a near-field communication antenna.

Preferably, the emitting part 26A is arranged at least partially facing the substrate 20 so as to illuminate the latter mainly with direct light (as opposed to reflected light).

The emitting part 26A has for instance the shape of a half-disc or a spherical cap or any other suitable shape. The connector part 26B constitutes a contact plate equipped with two lateral connection terminals 27 and with a base 31 capable of being attached to the substrate 20.

In the example illustrated, the diode 26 is assembled to the substrate 20 of the module 18 by soldering or brazing.

Preferably, in the preferred embodiment of the invention illustrated in the figures, the electronic module 18 incorporates the microcircuit 15 of the card 10.

In this embodiment, the card 10 also comprises an external interface 32 of contact pads 34 electrically connected to the microcircuit 15. This interface 32 allows the establishment of contact communication, for example when the card 10 is inserted into a matching card reader.

This interface 32 comprises for example a series of metal electrical contact pads 34 complying with a predefined microcircuit card standard. For example, the pads 34 are compliant with the ISO 7816 standard. In this embodiment, the pads 34 of the interface 32 correspond to the contacts C1 through C8 of the ISO 7816 standard.

The interface 32 of the card 10 is preferably made of a layer of metallic material such as copper but may also be made, as a variation, by silkscreening with conductive ink of the epoxy filled with gold or silver particles type or by silkscreening of an electrically conductive polymer.

Preferably, the pads 34 are electrically connected to the microcircuit 15 by electrically conductive wires (not shown) such as for example gold wires passing through vias made in the substrate 20 of the module 18, connected in their turn to electrically conductive traces extending over the inner face 20B of the substrate 20. These traces have not been shown in FIG. 3.

In the example described, the substrate 20 also bears on its visible face 20A a design 30 and the light source 26 is in this case preferably arranged so as to backlight the design 30.

Preferably, the design 30 covers at least partially the translucent region 28 of the substrate 20. In this case, the light source 26 extends preferably substantially in line with the design 30, which allows the design 30 to be backlit when the light source 26 is supplied with power.

The design 30 shown in this example is a face, preferably made of an electrically non-conductive material. Thus, the design 30 is for example made by silkscreening with an electrically non-conductive ink. The design 30 in this illustrated example has apertures 29 through which the light is transmitted.

In addition, as illustrated in FIG. 3 and preferably, the cavity 22 comprises for example a deep central area provided with a bottom 24 for housing the microcircuit 15 and a peripheral area raised with respect to the central area delimiting a terrace 38 with the bottom 24. The peripheral area comprises a supporting surface raised with respect to the bottom 24 of the cavity 22 on which rest the edges of the substrate 20 of the module 18.

Such a cavity 22 is generally obtained by machining, typically by milling or spot facing in two operations:
- a large spot facing operation to form the peripheral area corresponding to the depth of the terrace 38,
- a small spot facing operation to form the deeper central area.

In the embodiment illustrated by FIGS. 1 through 3, the card 10 is of the dual type, that is to say that it includes both a contactless interface capable of establishing near-field communication with an external terminal and a contact interface 32 capable of establishing communication with another external terminal by contact. However, as a variation, the card 10 can be solely of the contactless type. In this case, the card 10 is preferably not equipped with the external contact interface 32.

For establishing contactless communication with an external terminal, such as an external reader, the device 10 also includes a near-field communication antenna 40. This antenna 40 comprises for example a winding of electrically conductive turns comprising at least one turn.

In the preferred embodiment of the invention, this antenna 40 is connected to the microcircuit 15 to supply it with power. For example, the antenna 40 is connected to the microcircuit 15 by electrically conductive traces, by metal-plated vias, by electrically conductive wires, etc. (see FIG. 5).

The antenna 40 is preferably also borne by the module 18. Thus, preferably, the antenna 40 is borne at least partially by one of the faces of the substrate 20 of the module 18 and preferably by both faces of the substrate 20 of the module 18.

As shown in FIG. 2, it can be seen that the module has a substrate of generally oblong shape so that the antenna 40 can have an effective area corresponding substantially to the dimensions of the substrate. For example, the substrate has dimensions of 17.8 by 27.2 millimeters and a thickness comprised between 100 and 200 micrometers.

In addition, the antenna 40 consists of a winding of turns surrounding the microcircuit and running along the periphery of the substrate 20. For example, the antenna 40 extends over both faces 20A, 20B of the substrate 20 (FIG. 2).

Figure 5:
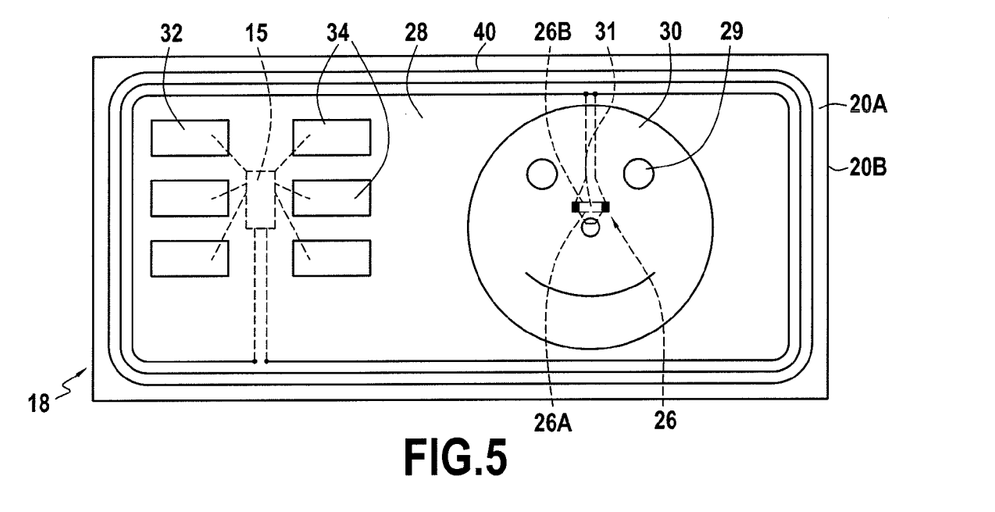
FIG. 5 shows the top view of FIG. 2 with some elements shown in transparency.

Preferably, the antenna 40 is also connected to the light source 26 for supplying the latter with power (for example by means identical with those used for the electrical connection of the microcircuit 15, see also FIG. 5). More precisely, the antenna 40 and the diode 26 are configured so that the diode 26 emits light when a current of predefined intensity circulates in the antenna 40, that is when near-field communication is established with an external contactless card reader.

The configuration of the antenna circuit consisting of the assembly of the microcircuit 15, the antenna 40 and the diode 26 is defined by the configuration parameters selected among a wire length of the antenna 40, a spacing between two turns of the antenna 40, a wire width of the antenna 40, a number of turns of the antenna 40, as well as the capacitance of the semiconductor junction of the diode 26.

The configuration parameters are thus adjusted so that the operating frequency of the antenna circuit allows near-field communication with an external card reader. For example, the operating frequency is tuned to 13.56 MHz as defined by the ISO 14443 standard.

In a second embodiment of the invention not shown in the figures, the light source 26 can be placed directly within the body 12. For example, the light source 26 is arranged at the bottom of the cavity 22.

In a third embodiment of the invention not illustrated in the figures, the device 10 comprises first and second near-field communication antennas designed respectively to supply the microcircuit 15 and the light source 26 with power. For example, in this case, each of the antennas is borne by one of the faces of the module's substrate.

The principal aspects of the operation of the card 10 of FIGS. 1 through 3 will now be described.

Initially, the user of the card 10 is distant from an external contactless reading terminal. When he comes close to the external terminal, electromagnetic coupling between the antenna of the terminal and the antenna 40 of the card 10 occurs.

A current of nonzero intensity then circulates in the antenna circuit. The microcircuit is supplied with power, allowing establishment of communication and the diode 26, through which the current also passes, illuminates.

The design 30 is then backlit, which gives an indication to the user that the establishment of contactless communication took place successfully.

The backlighting of the module produces an esthetic and high quality effect while being particularly simple to implement.

Thus, such a backlit module has a great advantage for dual cards but can also find various applications with other contact or contactless cards or other pocket or portable electronic devices.

In addition, the light source used can be of any type, a diode for example. The emission spectrum of the light source can be selected according to need, without being limited to the visible spectrum.

Figure 6:
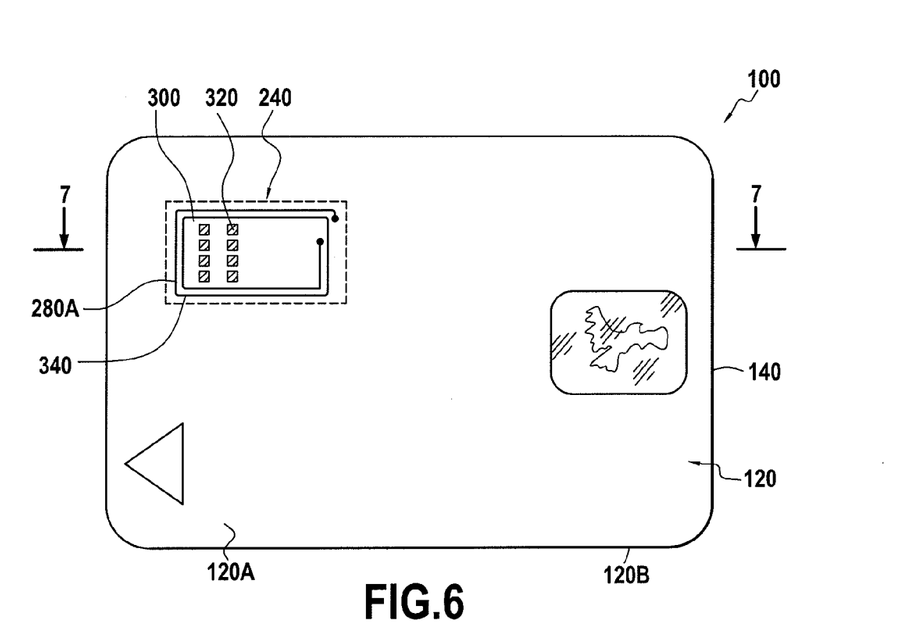
FIG. 6 is a top view of another microcircuit card according to the invention.

A microcircuit card according to the invention is shown in FIG. 6. This card is assigned the overall reference number 100.

As illustrated in FIG. 6, the card 100 comprises a body 120 in the general shape of a card delimiting first 120A and second 120B opposite faces. In addition, the body 120 delimits on its periphery an edge 140 of the card 100. This edge is defined as being the outer peripheral edge surrounding the card 100.

In this embodiment, the body 120 delimits the outer dimensions of the card 100. In this example and by preference, the dimensions of the card are defined by the ID-1 format of the ISO 7816 standard which is the format conventionally used for banking cards with dimensions of 86 millimeters by 54 millimeters. Of course, other card formats can be used within the scope of the invention, such as for example the ID-000 card format of the same standard.

In conformity with this embodiment, the body 120 incorporates the indicator light 160 (or light source 160) capable of at least partially illuminating the edge 140 of the card 100, from the inside. The illuminated part is visible from outside the card.

To this end, preferably, the body 120 comprises at least one region 180 capable of transmitting, in the thickness of the card, the light emitted by the indicator light 160. In other words, the luminous means 160 is arranged within the body 120 to illuminate the edge 140 of the card 100 by way of this transmission region 180.

Preferably, the transmission region 180 is made of a first material and at least partially surrounded by a second material different from the first material.

In this example, the body 120 consists of a stack of layers extending through the body 120 and the transmission region 180 constitutes one of the layers of the stack.

Figure 7:
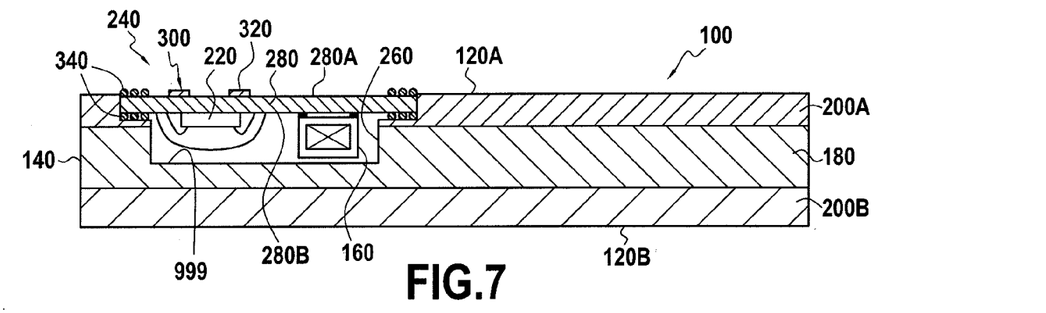
FIG. 7 shows a section view of the card of FIG. 6 along the line 7-7 of the FIG. 6.

As illustrated in FIG. 7, the body 120 comprises a stack of at least three layers: a central layer 180 constituting a transmission region interleaved between at least two external layers 200A, 200B made of the second material, these two external layers constituting a so called peripheral region.

Thus, preferably, the body 120 is formed by lamination, that is by formation, for example by means of a press and in a hot laminating operation, of the stack of layers or laminated sheets made for example of a thermoplastic material.

Of course, in a variation that is not illustrated, the body 120 can be formed by molding, from plastic for example.

The materials are chosen so that the transmission and peripheral regions 180, 200A, 200B constitute an optical waveguide in at least one direction.

The transmission layer 180 is made for example of polycarbonate. Possibly, the layer can also be made of a material supplied as a film of glass fibers such as compounds of the LGF (Light Guide Film) type based for example on polyurethane or acrylic.

For example, the peripheral layers 200A, 200B surrounding the polycarbonate layer are made of PVC (polyvinyl chloride).

Preferably, in order to optimize the optical guidance of the waves, the material of the transmission layer 180 has an index of refraction greater than the index of refraction of the materials constituting the two external layers 200A, 200B surrounding the transmission layer 180.

Preferably, the means 160 emits in the visible spectrum.

Preferably, the two external layers 200A, 200B are opaque. This makes it possible in particular to highlight the illumination of the edge of the card 10.

In a preferred embodiment, the luminous means 160 is optically concealed between the two faces 120A, 120B of the card 100.

As illustrated in FIG. 7, it is seen that the luminous means 160 is preferably arranged inside the transmission region 180.

Thus, in the preferred embodiment of the invention, the card 100 comprises a microcircuit 220 capable of exchanging, processing and/or storing data. In a preferred embodiment, the body 12 includes a microcircuit module 240 incorporating the microcircuit 220.

For example, preferably, the body 120 includes a cavity 260 for receiving the module 240, this cavity 26 being made at least partially within the thickness of the transmission region 180, so that the luminous means 160 extends at least partially into the transmission region 180 when the module 240 is housed in the cavity 260.

For example, the module 240 comprises a substrate 280 delimiting an outer face 280A designed to be visible and a masked inner face 280B designed to be facing the cavity 260 and bearing the microcircuit 220 as well as the luminous means 160.

Thus, preferably, the luminous means 160 is optically hidden within the card between the two faces 120A, 120B of the card 10. However, the luminous means 160 can be observed from the edge 140 of the card 100.

In the case where the substrate 280 is translucent and allows the light of the means 160 to pass, an optical mask can be arranged on the substrate 280 substantially in line with the luminous means 160. A design can for example be printed on the visible face 280A of the substrate 280 to mask the light emitted by the source 160. As a variation, an opaque substrate 280 can also be selected.

However, the illumination of the module 240 by the source 160 can also be exploited to contribute an additional esthetic or technical effect.

In the preferred embodiment of the invention, the card 100 is of the dual type, that is it allows both contact communication and contactless communication.

To this end, the microcircuit module 240 also includes a contact interface 30 electrically connected to the microcircuit 220. This interface allows the establishment of contact communication by the card 100, when the latter is inserted into a matching card reader. The interface 100 is for example borne by the outer face 280A of the substrate 280 of the module 240.

This interface 300 comprises for example a series of metal electrical contact pads 320, complying with a predefined microcircuit card standard. For example, the contact pads are compliant with the ISO 7816 standard. In this embodiment, the contact pads 320 of the interface 300 correspond to the contacts C1 through C8 of the ISO 7816 standard.

The interface 300 of the card 100 is preferably made of a layer of metallic material such as copper, but can also be made, as a variation, by silkscreening of conductive ink of the type consisting of epoxy ink filled with particles of silver or gold or by silkscreening of an electrically conductive polymer.

Preferably, the pads are electrically connected to the microcircuit by electrically conductive wires such as for example gold wires passing through vias made in the substrate of the module, connected in their turn to electrically conductive connecting traces extending over the inner face of the substrate. These traces have not been shown in FIG. 7.

For establishing contactless communication with an external terminal, such as an external reader, the card 100 also includes at least one near-field communication antenna 340.

In conformity with the invention, the antenna 340 is preferably connected to the microcircuit 220 and is able to supply power to the microcircuit 220 by electromagnetic coupling with an external terminal (not shown).

The communication frequency of the microcircuit with the external terminal is preferably the 13.56 MHz communication frequency defined by the ISO 14 443 standard.

Preferably, the antenna 340 is also connected to the indicator light 160 to supply it with power.

In one variation of the invention, the card 100 includes a first and second antennas connected respectively to the microcircuit 220 and to the luminous means 160. For example, the antenna 340 extends into the interior of the module 240. Preferably, the antenna 340 extends over the substrate 280, for example on the two opposite faces of the substrate, so that the antenna 340 is partially visible from the outside.

Preferably, the light source 160 is a light-emitting diode. As is known per se, a diode is an electronic component capable of emitting light when an electrical current passes through it. Preferably, the diode is of the SMC or surface-mount component type.

Thus, in conventional fashion, a surface-mount component can be applied to the substrate of a printed circuit by adhesive bonding, by brazing or by soldering, unlike a component provided with pins, the assembly whereof to the substrate requires making holes in the substrate to allow passage of the pins.

In the example illustrated in FIG. 7, the diode 160 is assembled to the substrate 280 of the module 240 by brazing. For example, the antenna 340 is connected to the luminous means 160 and in this case the luminous means 160 is supplied with power by the antenna 340.

In one variation, the luminous means 160 is electrically connected to an external power supply contact extending over the card 100, for example one of the power supply contacts of the interface 300 of contacts 320.

Preferably, the luminous means 160 is capable of being controlled according to the communication state of the microcircuit 220, for example according to the state of a transaction.

As a variation, the card 100 can be solely of the contactless type; in this case, the card 100 is preferably not equipped with the external contact interface. In another variation, the card 100 can be solely of the contact type and in this case, the card 100 is not equipped with the near-field communication antenna.

In another embodiment of the invention not illustrated in the figures, the card 100 can include at least two luminous means. For example, the two luminous means can be controlled according to first and second communication states of the microcircuit.

This makes it possible for the user to detect in a remarkable way two distinct communication states of the microcircuit which, in some applications, can allow a reduction in errors on the user's part in selecting applications, particularly when the card is operating in contact mode and is inserted into a card reader.

Indeed, in that case, the user clearly perceives the change in color of the card since the latter is illuminated along its edge.

The principal aspects of the card's operation illustrated by FIGS. 6 and 7 will now be described.

Initially, the user is out of range of the external contact terminal. When he moves the card close to the external terminal, the card illuminates along the edge. This change in state of the card is immediately perceived by the user.

In addition, when the user inserts the card in a contact card reader, the indicator light is supplied with power via the contact interface 300 and the edge of the part of the card extending outside the card reader is also illuminated.

In particular, the luminous means can be incorporated into the body. For example, the luminous means is connected to a near-field communication antenna to supply it with power, the assembly being arranged on one layer of a stack of layers laminated together constituting the body of the card.

The invention claimed is:

1. A microcircuit module configured to be mounted in a cavity of a body of an electronic device, the module comprising a substrate delimiting first and second opposite faces, the first face being configured to be oriented towards an outside of the electronic device so that it is visible when the module is mounted in the cavity, the second face being configured to be oriented towards a bottom of the cavity when the module is mounted in the cavity, the module including a light source borne by the second face of the substrate and capable of lighting at least a part of the module, said part being visible from outside said device when the module is mounted in the cavity, the module further comprising a microcircuit borne by the second face of the substrate and a near-field communication antenna electrically connected to the microcircuit, the light source and the near-field communication antenna being configured so that the light source emits light when a current of a predefined intensity circulates in the antenna.

2. The module according to the claim 1, wherein the electronic device is a microcircuit card comprising in its thickness a transmission region through which the light emitted by the source can be transmitted, said light source being borne on said second face to illuminate at least a part of an edge of said card, this edge being perpendicular or almost perpendicular to said opposite faces when the module is disposed on said cavity.

3. A microcircuit card comprising a module according to claim 2, wherein said transmission region is made of a first material and surrounded at least partially by a second material different from the first material, the materials being selected to constitute an optical waveguide in at least one direction.

4. The card according to claim 3, wherein, the body consisting of a stack of layers extending through the body, the transmission region constituting one of the layers of the stack.

5. The card according to claim 3, wherein the light source is arranged within the transmission region.

6. The card according to claim 5, wherein the light source is optically concealed between the first and second faces of the card.

7. The card according to claim 3, wherein the cavity is made at least partially within the thickness of the transmission region so that the light source extends at least partially into the transmission region.

8. The card according to claim 3, wherein the light source is capable of being controlled according to a communication state of the microcircuit.

9. The card according to claim 8, including first and second light source capable of being controlled according to first and second communication states of the microcircuit.

10. The card according to claim 3, being a microcircuit card of the contactless, dual or contact type.

11. The module according to claim 1, wherein said substrate comprises a transmission region through which the light emitted by the source can be transmitted, said part visible from the outside of the device being a part of said first face.

12. The module according to claim 11, wherein the substrate bears on the first face a design and the light source is arranged so as to backlight the design.

13. The module according to claim 11, wherein the substrate has a generally oblong shape.

14. The module according to claim 11, wherein the substrate is made of a material comprised essentially of glass-epoxy, of polyimide, of Teflon, of polyester or of PET.

15. The module according to claim 11, wherein the light source is arranged so as to illuminate the substrate in direct light.

16. The module according to claim 15, wherein the light source consists of a component comprising a light-emitting part arranged at least partially facing the substrate.

17. The module according to claim 1, comprising an interface of external contracts electrically connected to the microcircuit and borne by the first face of the substrate.

18. The module according to claim 1, the module including first and second near-field communication antennas capable of supplying power to the microcircuit and the light source respectively.

19. The module according to claim 1 including a near-field communication antenna capable of simultaneously supplying power to the microcircuit and the light source.

20. The module according to claim 1, wherein the light source comprises a light-emitting diode.

21. A microcircuit card, comprising a module and a body provided with a cavity for receiving the module, the module comprising a substrate delimiting first and second opposite faces, the second face being turned towards a bottom of said cavity, the device comprising a light source arranged within the body so as to light the first face of the substrate through said substrate, the module further comprising a microcircuit borne by the second face of the substrate and a near-field communication antenna electrically connected to the microcircuit, the light source and the near-field communication antenna being configured so that the light source emits light when a current of a predefined intensity circulates in the antenna; and wherein the light source is arranged at the bottom of the cavity.

22. The card according to claim 21, wherein the card is a microcircuit card of the contactless, dual or contact type.

* * * * *